United States Patent [19]
Bonora et al.

[11] Patent Number: 5,846,338
[45] Date of Patent: Dec. 8, 1998

[54] METHOD FOR DRY CLEANING CLEAN ROOM CONTAINERS

[75] Inventors: Anthony C. Bonora, Menlo Park; N. Kedarnath, Sunnyvale; Joshua T. Oen, Fremont, all of Calif.

[73] Assignee: Asyst Technologies, Inc., Fremont, Calif.

[21] Appl. No.: 584,374

[22] Filed: Jan. 11, 1996

[51] Int. Cl.$^6$ ................................................ B08B 3/00
[52] U.S. Cl. ............................ 734/11; 134/8; 134/22.1; 134/22.18; 134/21; 134/26; 134/30; 134/37; 451/38; 451/39; 451/40
[58] Field of Search ............... 134/8, 11, 22.1, 134/22.18, 21, 26, 30, 37; 351/38, 39, 40

[56] References Cited

U.S. PATENT DOCUMENTS

| | | | |
|---|---|---|---|
| 4,806,171 | 2/1989 | Whitlock et al. | 134/7 |
| 4,924,643 | 5/1990 | Buiguez | 51/320 |
| 4,977,910 | 12/1990 | Miyahaka et al. | 451/39 |
| 5,108,512 | 4/1992 | Goffneff et al. | 134/7 |
| 5,125,979 | 6/1992 | Swain et al. | 134/7 |
| 5,232,512 | 8/1993 | Swain | 134/7 |
| 5,315,793 | 5/1994 | Peterson et al. | 51/415 |
| 5,364,472 | 11/1994 | Heyns et al. | 134/7 |
| 5,365,699 | 11/1994 | Armstrong et al. | 451/7 |
| 5,372,652 | 12/1994 | Srikrishman et al. | 134/7 |
| 5,390,450 | 2/1995 | Goenka | 451/39 |
| 5,405,283 | 4/1995 | Goenka | 451/39 |
| 5,409,418 | 4/1995 | Krone-Schmidt et al. | 451/75 |
| 5,415,584 | 5/1995 | Brooke et al. | 451/99 |
| 5,445,553 | 8/1995 | Cryer et al. | 451/40 |
| 5,456,629 | 10/1995 | Bingham | 451/39 |
| 5,462,605 | 10/1995 | Szucs | 134/7 |
| 5,525,093 | 6/1996 | Palmer, Jr. | 451/40 |
| 5,545,073 | 8/1996 | Kneisel et al. | 451/39 |
| 5,616,067 | 4/1997 | Goenka | 451/39 |
| 5,644,855 | 7/1997 | McDermott et al. | 34/516 |
| 5,740,845 | 4/1998 | Bonora et al. | 141/292 |

OTHER PUBLICATIONS

Abuzeld et al. "Particle Removal Using Aerosol Jet Dry Cleaning Technique"–Proc.–Inst. Environ. Sci. (1994), 40th (vol. 1) 413–18.

*Primary Examiner*—Jill Warden
*Assistant Examiner*—Sharidan Carrillo
*Attorney, Agent, or Firm*—Fliesler, Dubb, Meyer & Lovejoy LLP

[57] ABSTRACT

A method and apparatus for dry cleaning a semiconductor wafer storage and transport pod. After the pod is located with respect to the cleaning chamber and opened to expose the interior surfaces of the pod to the cleaning chamber, the pod is conditioned in preparation for the cleaning process. The conditioning of the pod includes purging the pod and cleaning chamber with an ionized nitrogen gas to rid the pod and cleaning chamber of airborne contaminants and to neutralize static electrical charges on the pod surfaces. The conditioning process further includes heating the pod surfaces to prevent condensation of moisture and organic contaminants thereon. After the conditioning process, the pod is cleaned with a dry aerosol sprayed onto the pod surfaces. The aerosol spray is comprised of an ionized carbon dioxide/nitrogen ($CO_2/N_2$) gas and fine particles of $CO_2$. The dry cleaning apparatus further includes a circulation subsystem for circulating a fluid through the pod and cleaning chamber to remove airborne particulate, such as those dislodged from the pod surfaces by the $CO_2/N_2$ aerosol spray. A filter provided within the path of the circulating fluid removes particulates from the circulating fluid.

12 Claims, 3 Drawing Sheets

METHOD FOR DRY CLEANING CLEAN ROOM CONTAINERS

BACKGROUND OF THE INVENTION

1. Field of the Invention

The present invention relates to containers used to store and transport semiconductor wafers during the wafer fabrication processes, and in particular, to a method and apparatus for dry cleaning the containers to remove particulate contaminants from the surfaces of the containers.

2. Description of the Related Art

Standardized mechanical interface (SMIF) systems, first proposed by the Hewlett-Packard Company and disclosed in U.S. Pat. Nos. 4,532,970 and 4,534,389, have now become accepted clean-room equipment for semiconductor manufacturing. The purpose of the SMIF system is to reduce particle fluxes onto articles, for example, semiconductor wafers. This end is accomplished, in part, by mechanically ensuring that during transportation and storage the gaseous medium (such as air or nitrogen) surrounding the wafers is essentially stationary relative to the wafers and by ensuring that particles from the ambient environment do not enter the immediate wafer environment.

A SMIF system has three main components: (1) minimum volume, sealed pods used for storing and transporting wafer cassettes; (2) canopies placed over cassette ports and wafer processing areas of processing equipment so that the environments inside the pods and canopies (after having clean air sources) become miniature clean spaces; and (3) a transfer mechanism to load/unload wafer cassettes from a sealed pod without contamination of the wafers in the wafer cassette from external environments.

Wafers, generally supported by a cassette resting on the pod door, are transferred from a pod to an interior of a processing station in the following manner. First, a pod is placed at the interface port on top of the canopy of a particular processing station. Each pod includes a cover and a baseplate door designed to mate with doors on the interface ports of the processing station canopies. Once located at the interface port, latches release the baseplate door and the canopy port door simultaneously; the baseplate door and the interface port door are opened simultaneously so that particles which may have been on the external door surfaces are trapped ("sandwiched") between the baseplate and interface port doors. A mechanical elevator lowers the two doors, with the cassette riding on top, into the canopy covered space. A manipulator picks up the cassette and places it onto the cassette port/elevator of the equipment. After processing, the reverse operation takes place.

Defects due to particulate contamination are a major source of yield loss and reduced product reliability in the semiconductor industry. As device geometry continues to shrink, and chip and wafer size continue to increase, even low levels of contamination can have a major effect on device performance. Currently, mini-environment based IC manufacturing facilities control airborne particles>0.1 $\mu$m. However, conventional surface cleaning systems are unable to efficiently remove particles much smaller than 1.0 $\mu$m, and surface contamination continues to be of high priority to semiconductor manufacturers. Surfaces surrounding the wafer during the manufacturing process, such as the interior surfaces of a SMIF pod, can be a significant source of particulate contamination on the wafer surface. Therefore, it is essential that surfaces exposed to the wafer be cleaned regularly and effectively. The increasing sensitivity of the manufacturing process has made the removal of submicron particles from these surfaces essential.

Removal of particulates from surfaces has been the subject of numerous investigations. In spite of major advances in the area of surface cleaning, removal of submicron particles from surfaces continues to challenge researchers. Currently, semiconductor manufacturers use wet cleaning processes, such as deionized, or DI, water rinse and DI water and surfactant cleaning. Other cleaning processes include solvent based cleaning, and dry cleaning using high velocity gas jets to remove contamination from surfaces.

Wet cleaning (DI water based cleaning) systems are widely used at present because they are effective in removing particles and are relatively cost efficient. However, such systems have several disadvantages. Although they effectively remove particles, the DI water based solutions may leave behind contaminating residues that adversely affect the product yield. Second, in order to prevent cleaning particles from becoming lodged between adjoining pod components, the pod must be dismantled prior to cleaning and then reassembled after cleaning. Not only does this significantly increase the time it takes to clean a pod, but the reassembly is a potential source of contaminants. Third, a drying cycle is required to remove moisture, especially water trapped in blind holes and crevices after cleaning, which further increases the time of the cleaning processes. Fourth, liquids are relatively ineffective at removing particles from blind holes and crevices frequently found on the surfaces to be cleaned.

Solvent based cleaning (using Freon, Isopropyl, etc.) is relatively effective, but adverse environmental impacts and the high cost of handling and disposal makes such cleaning processes undesirable.

High velocity gas jets provide one option for dry cleaning, but they generally lose effectiveness as contaminant particles become smaller than 10 $\mu$m. As particle sizes decrease, they become more difficult to remove. There are several reasons for the difficulty of removing submicron particles from surfaces. Adhesion to the substrate involves electrostatic forces and bonding by surface layers of absorbed water and organic materials. Also, smaller oddshaped particles tend to have a higher percentage of their total surface area in contact with the substrate, thus allowing a large area of adhesion for a relatively small mass. Moreover, small particles are in general more deeply buried within surface depressions. Thus, smaller particles have increased adhesion, less area exposed to any fluid that is flowing over the surface, and are not easily removed by aerodynamics drag effects. Further still, in any aerodynamics flow, there is a boundary layer where the velocity within the boundary layer is far less than that at some distances from the surface. This also reduces the chances that small particles will be removed from the surfaces by fluid flow.

SUMMARY OF THE INVENTION

It is therefore an advantage of the present invention to provide a method and apparatus for dry cleaning a semiconductor wafer storage and transport pod.

It is a further advantage of the present invention to dry clean an interior of a wafer storage and transport pod without exposure of the pod interior to an environment external to the cleaning apparatus environment.

It is another advantage of the present invention to provide a dry cleaning process and apparatus for quickly cleaning the interior of a wafer storage and transport pod without requiring disassembly of the pod beyond separation of the pod cover from the pod door.

It is a still further advantage of the present invention to provide a dry cleaning process and apparatus capable of removing particulates of 0.5 $\mu$m with an efficiency of at least 90%.

It is another advantage of the present invention to provide a process and apparatus for dry cleaning a wafer storage and transport pod which does not require a separate drying step and does not generate toxic waste products.

It is a further advantage of the present invention to provide a process and apparatus for dry cleaning a wafer storage and transport pod at a cost that is comparable to conventional aqueous and solvent based cleaning methods.

These and other advantages are accomplished by the present invention which in general relates to a method and apparatus for dry cleaning an interior of a semiconductor wafer storage and transport pod using a mixture comprised of a carbon dioxide/nitrogen ($CO_2/N_2$) aerosol including $CO_2$ particles. The cleaning process takes place in an ultra-clean environment and the pod surfaces to be cleaned are completely isolated from the outside environment during the cleaning process.

Wafer storage and transport pods may be cleaned according to the present invention by first locating a sealed pod on a top surface of a cleaning chamber, separating the pod cover from the pod door, and lowering the pod door into the cleaning chamber. Once positioned on the top surface of the cleaning chamber, the interior surfaces of the pod cover and pod door may be cleaned in an environment isolated from the surrounding atmosphere. The pod cover may rest on an O-ring or similar type gasket provided on the top surface of the cleaning chamber to ensure a tight seal between the pod cover and the interior of the cleaning chamber. It is understood that a tight seal is not necessary for the operation of the present invention. The top surface of the cleaning chamber further includes latches for securing the pod cover in position during the cleaning process.

Once the pod cover and pod door are positioned for cleaning, the environment within the cleaning chamber is conditioned in preparation for the cleaning process. The environment conditioning begins with a purging cycle to remove airborne particulates and moisture from within the cleaning chamber. This is accomplished by injecting a dry, filtered and ionized nitrogen gas into and through the cleaning chamber and pod cover to flush the airborne particulates and moisture out of the chamber. The nitrogen is ionized to neutralize static electrical charges which may be present on the pod surfaces or within the cleaning chamber. Neutralizing the static electrical charges reduces the adhesive forces of the particulates to the pod surfaces and to each other. The surfaces of the pod to be cleaned are also heated during the conditioning process to prevent condensation thereon of moisture and/or organic contaminants from within the gases used during the cleaning process. Heating of these surfaces may be accomplished either by heating the nitrogen gas or by a separate heater within the cleaning chamber.

After the cleaning chamber has been environmentally conditioned, a nozzle head for distributing aerosol spray is moved into a position for cleaning the pod surfaces. Initially, the nozzle head is in a retracted position to allow unobstructed lowering of the pod door into the chamber. In a preferred embodiment, the nozzle head includes two nozzles, one for directing the aerosol spray upward into the pod cover and another for directing the aerosol spray downward onto the pod door. The nozzle head is supported by a mechanical arm that translates and rotates the nozzle head during application of the aerosol spray to ensure that all surfaces of the pod are sufficiently cleaned.

In order to form the $CO_2/N_2$ aerosol spray, clean high pressure gas or liquid $CO_2$ from a $CO_2$ reservoir is allowed to expand through an expansion valve, or orifice, to a low pressure region. The rapid expansion of the $CO_2$ fluid through the expansion orifice causes a rapid drop in both pressure and temperature of the $CO_2$, which in turn results in a phase change of the high pressure $CO_2$ to an aerosol comprised of a $CO_2$ gas with solid particles, or snowflakes, of $CO_2$ within the gas.

The $CO_2$ aerosol thus formed is passed through a mixing and acceleration chamber where ionized nitrogen gas is added to the aerosol. The addition of nitrogen at a high speed serves to break up the $CO_2$ flakes into small particles and also serves to accelerate the aerosol spray. The ionization of the nitrogen neutralizes any static electrical charges which may have built up within the aerosol spray. The $CO_2/N_2$ aerosol thus formed is transported through a length of flexible hose to the nozzle head, and sprayed through the nozzles onto the surfaces of the pod to be cleaned. This method of remote generation of the $CO_2/N_2$ aerosol, and the subsequent transport of the aerosol to the nozzles, allows greater system configuration flexibility in that the aerosol generation equipment need not be located proximate to the spray nozzles or cleaning chamber.

The fine $CO_2$ particles within the aerosol spray are effective in removing very small particulates on the pod surfaces due largely to energy transfer upon contact of the $CO_2$ particles with the particulates. The collision of the $CO_2$ particles with the particulates imparts kinetic energy to the particulates which is generally sufficient to overcome the surface adhesion force of the particles to the pod surfaces. The ionized nitrogen within the aerosol spray is also significant in aiding removal of the particulates by neutralizing static electrical charges on the pod surfaces to thereby decrease the surface adhesion of the particulates to the pod surfaces and each other.

The cleaning apparatus further includes a fluid circulation subsystem for circulating a fluid through the cleaning chamber. Airborne particulates, such as the dislodged particulates, become entrained within the flow of circulating fluid and are drawn out of the cleaning chamber. The contaminant rich fluid exiting the chamber is passed through ULPA and/or chemical filters before being recirculated into the chamber interior.

The $CO_2/N_2$ spray tends to cool the surfaces it contacts. Therefore, in order to minimize condensation of moisture and organic contaminants on the surfaces being cleaned, the cleaning chamber includes at least one cold surface acting as a condensation target. The presence of the condensation target as well as the heating of the pods' interior surfaces minimizes condensation of moisture and organic contaminants on the pod surfaces. The condensation target is kept cold with respect to the interior surfaces of the pod and the circulating fluid within the pod by diverting a small fraction of the cold aerosol spray generated as described above. The target is preferably located within the spray assembly and may be the housing of the spray assembly itself. A heating element is preferably included adjacent to the target so that the target may be cleaned at the end of each cleaning cycle by heating it and evaporating away the condensed contaminants.

After the cleaning process is completed, the nozzles are returned to their retracted position and the pod door is once again sealed together with the pod cover.

BRIEF DESCRIPTION OF THE DRAWINGS

The invention will now be described with reference to the figures, in which.

DETAILED DESCRIPTION

The present invention will now be described with reference to FIGS. 1 through 6 which in general relate to a method and apparatus for dry cleaning a wafer storage and transport pod using a $CO_2/N_2$ aerosol spray. While the invention is described in the context of a SMIF pod, it is to be understood that the method and apparatus according to the present invention may be used in any of various cleanroom applications where it is necessary to remove particulates on the order of 0.5 $\mu$m or greater from off a surface. Within the semiconductor field, the present invention may be used for example to clean wafers, wafer cassettes and reticles. Additionally, the present invention may be used in clean room applications unrelated to the field of semiconductors.

Figure 1:
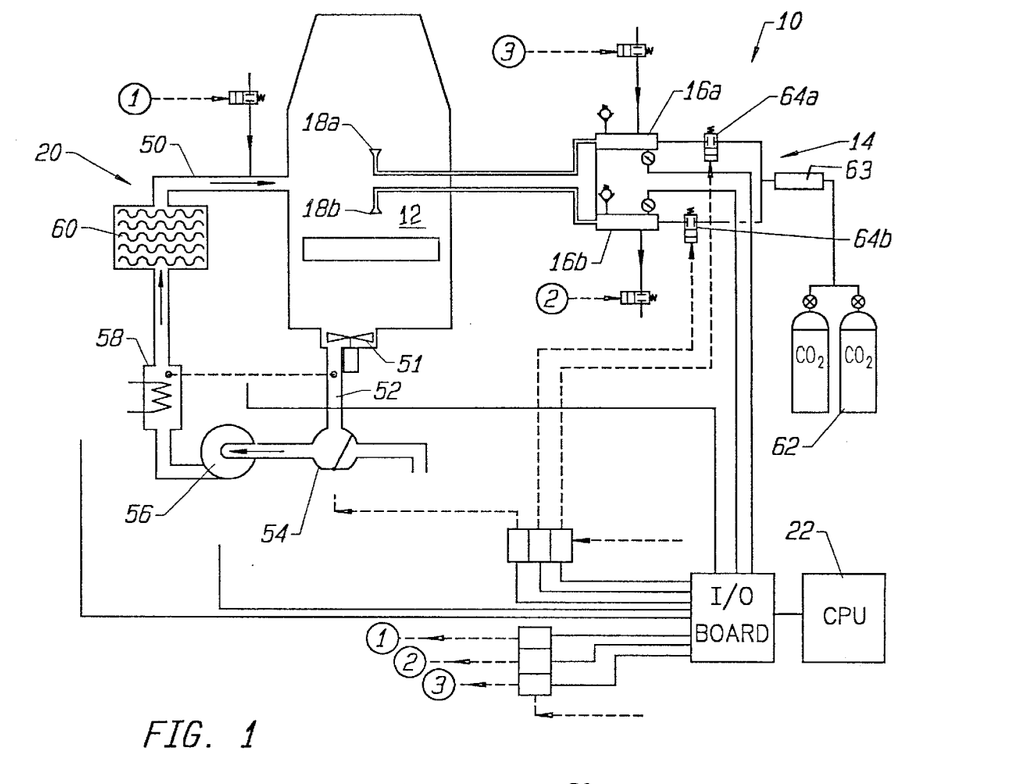
FIG. 1 is a schematic representation of an apparatus according to the present invention for dry cleaning a wafer storage and transport pod.

Referring now to FIG. 1, there is shown a schematic representation of a cleaning apparatus 10 according to the present invention including a cleaning chamber 12, expansion valves 64a and 64b, mixing and acceleration chambers 16a and 16b, spray nozzles 18a and 18b, fluid circulation subsystem 20 and central processing unit ("CPU") 22.

Figure 2:
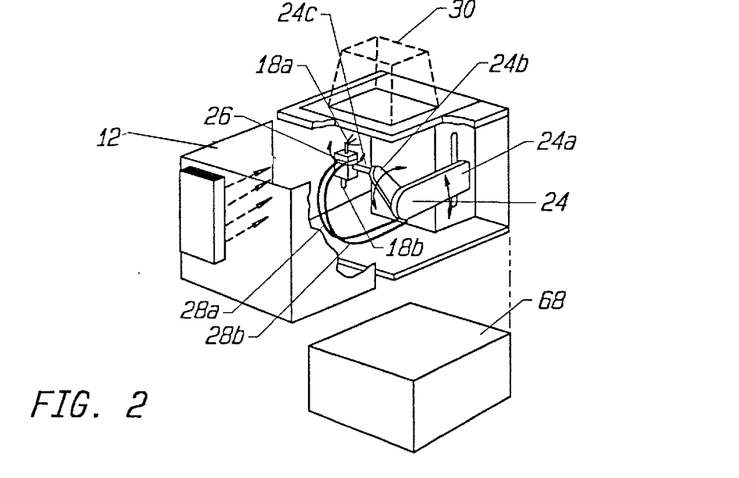
FIG. 2 is an isometric view of an apparatus according to the present invention showing the interior of the cleaning chamber and a pod to be cleaned located on a top surface of the apparatus.

Referring to FIG. 2, cleaning chamber 12 in one embodiment of the invention may have a height of approximately 16 inches, a length of approximately 22 inches and a width of approximately 11 inches, as measured from its outer surfaces, and an interior cleaning chamber volume of approximately 3900 cubic inches. These dimensions may vary in alternative embodiments of the invention. The walls surrounding cleaning chamber 12 are preferably formed of a non-reactive and durable metal such as for example stainless steel.

A mechanical arm 24 is located within chamber 12 for supporting an aerosol applicator in the form of nozzle head 26 having spray nozzles 18a and 18b mounted thereon. Prior to loading of the pod into cleaning position as described hereinafter, the nozzle head is in a retracted position. After the pod is positioned for cleaning, mechanical arm 24 moves the nozzle head 26 into the position shown in FIG. 2, where it can evenly distribute the aerosol cleaning mixture onto all the surfaces to be cleaned. In a preferred embodiment, mechanical arm 24 includes translational subarm 24a mounted for vertical translation with respect to chamber 12, rotational subarm 24b mounted for rotation with respect to translational subarm 24a, and rod 24c for supporting nozzle head 26 and allowing nozzle head 26 to pivot in a plane perpendicular to rod 24c. As shown in FIG. 2, nozzle head 26 is capable of translation and rotation within a plane perpendicular to rod 24c. However, it is understood that in alternative embodiments, nozzle head 26 may be supported for movement in one or more of six directions, i.e., translation in the x, y and z planes, and rotation about the x, y and z axes. The movement of each of the components of the mechanical arm 24 are controlled in a known manner by the CPU 22.

Cleaning chamber 12 further includes flexible hoses 28a and 28b for transferring the $CO_2/N_2$ aerosol spray from the aerosol generation systems (described below) to nozzles 18a and 18b, respectively. Hoses 28a and 28b are preferably flexible, and are good thermal insulators to prevent any significant change in the temperature of the aerosol as it travels through the hoses. In a preferred embodiment, the hoses 28a, 28b are further electrically conductive to minimize the build up of static electrical charges generated during aerosol transport. Although hoses 28a, 28b may be formed of several materials, a preferred material is PTFE. Hoses 28a and 28b preferably have an inner diameter of approximately 0.25 to 0.375 inches, and are provided of a sufficient length to allow nozzle head 26 to move through its entire range of motion without creating stress locations within hoses 28a and 28b. In a preferred embodiment, hoses 28a and 28b are each approximately 4 feet long. It is understood that the length and inner diameter of hoses 28a and 28b may vary in alternative embodiments of the invention.

Figure 3:
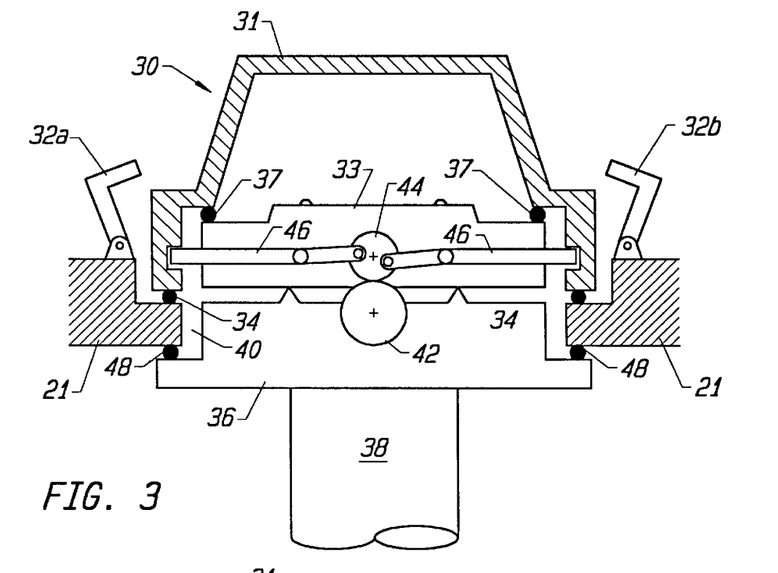
FIG. 3 is a cross-sectional view of a pod located on top of a cleaning chamber according to the present invention.
Figure 4:
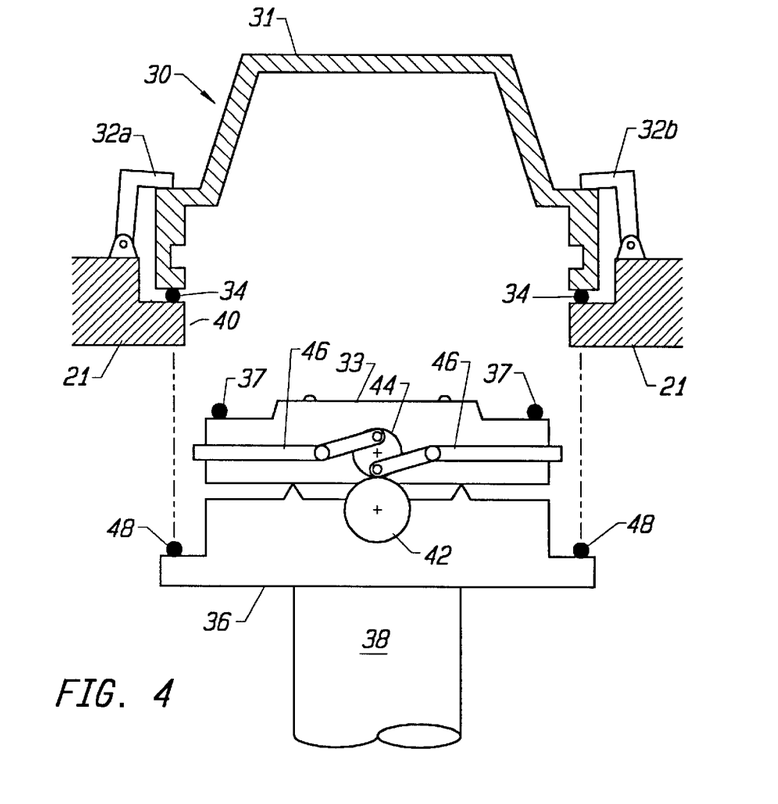
FIG. 4 is a cross-sectional view of a pod cover separated from a pod door in preparation for cleaning.

Referring now to FIG. 2 through 4, a pod 30 such as used in a SMIF system may preferably include a pod cover 31 and pod door 33. A sealing gasket 37 is provided between the cover 31 and door 33 to isolate and seal the interior of pod 30 against the external environment.

FIGS. 3 and 4 show a top portion of a cleaning chamber 12 according to the present invention with a pod 30 located thereon. The cleaning chamber 12 includes a port plate 21 having pod cover restraint latches 32a and 32b, a port access door 36, and perimeter O-ring gaskets 34 and 48. Gasket 48 is provided between the port plate 21 and an upper surface of port access door 36 to isolate and seal the cleaning chamber 12 when no pod is present. Cleaning chamber 12 further includes an elevator 38. In preparation for cleaning of pod 30, the pod is manually or automatedly seated on top of the cleaning chamber. The top of the cleaning chamber may include a plurality of angled guide blocks (not shown) to allow easy guidance of the pod into proper position on top of the cleaning chamber.

When properly located on top of the cleaning chamber 12, the pod door 33 lies in contact with the port access door 36, and the outer rim of pod cover 31 lies in contact with the port plate 21. In this position, a bottom perimeter of the pod cover 31 registers against the 0-ring gasket 34 on the port plate to form an airtight seal between the pod 30 and the port plate 21. Thus, once the pod is loaded on the cleaning chamber, all further activity involved in the cleaning of pod 30 is done in an environment isolated from and sealed against the outside environment.

Pod cover restraint latches 32a and 32b are provided to secure the pod cover 31 to the port plate 21. Once the pod 30 is properly positioned on the cleaning chamber, the latches 32a and 32b are pivoted from a first position shown in FIG. 3 to a second position shown in FIG. 4. In the second position, the latches 32a and 32b positively secure the pod cover to the port plate. The movement of the latches 32a and 32b between the first and second positions may be accomplished by a conventional solenoid or motor, the operation of which solenoid or motor is controlled by the CPU 22.

After the latches 32a and 32b secure the pod cover 31 to the port plate 21, the pod cover 31 is decoupled from the pod door 33. This is accomplished by a decoupling mechanism provided in the port access door 36. The decoupling mechanism may comprise a gear 42 that meshes with a gear 44 conventionally provided within the pod door 33. Rotation of the gear 42 rotates the gear 44, which in turn causes arms 46 to retract from their engagement with the pod cover 31, thereby separating the pod cover from the pod door. As would be appreciated by those skilled in the art, the decoupling mechanism may be comprised of structures other than a gear 42 to retract arms 33 from engagement with the pod cover to thereby separate the pod cover from the pod door. Gear 27 may be driven by a driver motor (not shown) or similar device, the operation of which is controlled by the CPU 22. It is further understood that, in alternative embodiments, the decoupling mechanism may decouple the pod cover from the pod door before or during pivoting of the latches 32a and 32b to the restraining position.

Port access door 36 is supported and vertically translated by means of elevator 38, which extends down out of the bottom of the cleaning chamber. A motor or similar device (not shown), located below the chamber and which is controlled by the CPU, raises and lowers the elevator to the desired elevation. After the pod cover 31 and pod door 33 are separated, the elevator 38 lowers the pod door into the cleaning chamber 12. Contaminants on the bottom surface of the pod door 33 and the top surface of the port access door 36 remain trapped between the pod door and port access door as they are lowered into the chamber 12. In a preferred embodiment, the shaft 38 may lower the pod door approximately 12 inches into the chamber 12 so as to allow the mechanical arm 24 to locate the nozzle head 26 in position between the pod cover 31 and the pod door 33.

As shown in FIG. 4, after the pod door 33 and port access door 36 move downward and the pod cover 31 is separated from the pod door 33, gasket 37 no longer provides a seal for the interior of the pod. At this point, the interior of the pod and the interior of the cleaning chamber comprise a single isolated environment that remains sealed against the external environment. The seal is accomplished by the O-ring gasket 34 provided between the port plate 21 and the pod cover 31. As previously explained, this seal is established when the pod 30 is located on the cleaning chamber 12.

After the pod door is positioned within the chamber 12, the chamber interior including the interior surfaces of pod cover 31 and pod door 33 is conditioned in preparation for cleaning. A first step of the conditioning process involves a purging cycle to remove airborne particulates and moisture from within the cleaning chamber 12. This is accomplished by injecting ultra-pure (contaminant free) ionized nitrogen gas into the chamber through a line 50 (FIG. 1) of the fluid circulation subsystem 20. Airborne particulates and/or molecular contaminants become entrained within the fluid flow, and are thereafter drawn out of chamber 12 by a circulation fan 51, and down through line 52 of the fluid circulation subsystem 20. The nitrogen gas is ionized to neutralize static electrical charges on the surfaces within chamber 12, thereby reducing the adhesion forces of the particulates to the pod surfaces and to each other.

It is also desirable during the conditioning process to heat the surfaces within the chamber 12 to prevent condensation of moisture and/or organic contaminants thereon. This may be accomplished by elevating the temperature of the purging nitrogen gas before it is injected into the chamber 12. Alternatively, the pod surfaces may be heated by conventional heating elements located in contact with exterior walls of the pod.

In a preferred embodiment, upon completion of the conditioning process, the temperature of the pod surfaces within the chamber 12 are about 40° C. to 50° C., and the humidity is less than approximately 30%. Conventional temperature and humidity sensors (not shown) may cooperate with CPU 22 in a known manner to indicate when the proper cleaning conditions have been established within chamber 12. Alternatively, the nitrogen purge and heating of the surfaces within chamber 12 may be performed for a predetermined period of time after which it is known that the desirable cleaning conditions have been established. In general, the conditioning process lasts for approximately 100 seconds or less.

In addition to the purge cycle, the circulation subsystem 20 of cleaning apparatus 10 provides a circulating fluid through chamber 12 during operation of the cleaning cycle. The subsystem 20 operates by injecting a fluid such as nitrogen or ultra-pure air into the chamber 12 via the line 50. Airborne particulates and/or molecular contaminants become entrained within the fluid flow, and are thereafter drawn out of chamber 12 by the circulation fan 51, and down through line 52. Circulation subsystem 20 further includes a pneumatic valve 54 for either expelling fluid from the cleaning apparatus 10 (as is the case of the purging nitrogen gas during the conditioning process), or for recirculating fluid back through the circulation subsystem for re-entry into the cleaning chamber 12. (Valve 54 is shown in FIG. 1 in a position to recirculate fluid back into chamber 12). The operation of valve 54 between the first position where fluid from line 52 is expelled, and the second position where fluid from line 52 is recirculated, is controlled in a known manner by the CPU 22. From the pneumatic valve 54, the circulation fluid circulates to a conventional blower or pump 56 which in turn circulates the fluid through a heater 58 and then back into chamber 12. A filter 60 is further included as part of circulation subsystem 20 to purify the contaminant rich fluid exiting the cleaning chamber 12 prior to re-entry into the chamber. Filter 60 may be conventional ULPA (ultra-low particulate absolute) filter for removing particulates from the fluid stream and/or a conventional chemical filter for removing molecular contaminants from the fluid stream.

The circulation of fluid by circulation subsystem 20 serves both to heat the surfaces to be cleaned within chamber 12 to prevent condensation thereon, and also to remove airborne particulates dislodged from the pod or chamber walls, or otherwise present within the chamber 12 during the cleaning process. The circulation subsystem 20 may be controlled by CPU 22 to operate before, during, and after the cleaning process. When no cleaning process in being performed, the subsystem 20 may be in a stand-by mode, where fluid is circulated at a lower flow rate.

After the pod door 33 has been lowered into the chamber 12 and after the surfaces to be cleaned have been conditioned during the conditioning process, the nozzle head 26 is moved from the retracted position to the operating position (FIG. 2) as described above. The pod door has been omitted from FIG. 2 for clarity. Once the nozzle head 26 is properly positioned, the $CO_2/N_2$ aerosol spray is supplied to the nozzle head as explained hereinafter and the cleaning process begins.

The mixture used to clean the pod surfaces is comprised of a $CO_2/N_2$ aerosol spray which is formed as follows. Clean (99.99% purity) high-pressure $CO_2$ fluid is received within cleaning apparatus 10 from a $CO_2$ reservoir 62. The $CO_2$ fluid is stored and initially fed to the cleaning apparatus 10 at a pressure of approximately 55 atm., and a temperature of approximately 20° C. The fluid $CO_2$ is passed through an inline particulate and/or chemical filter 63 and then fed to valves 64a and 64b. Throughout the remainder of the development of the $CO_2/N_2$ aerosol spray, the fluid travels and is developed along two distinct paths, one ending at nozzle 18a and the other ending at nozzle 18b. For clarity, only one such path, i.e., that ending at nozzle 18a, shall be described hereinafter. It is understood that the fluid sprayed from nozzle 18b undergoes the same processes and development as that described hereinafter for the fluid sprayed from nozzle 18a. In alternative embodiments, it is understood that the fluid may be separated into two distinct paths at any point during the development of the aerosol spray according to the present invention up to and including the point at which the aerosol spray reaches nozzle head 26. Moreover, it is understood that an alternative embodiment of the present invention may comprise a single aerosol spray fluid path with a single spray nozzle which translates and/or rotates to apply the aerosol spray to all surfaces to be cleaned.

Figure 5:
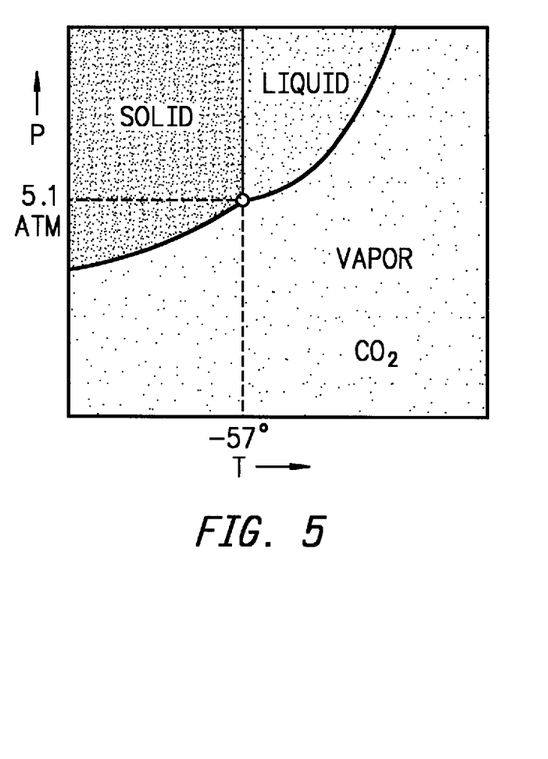
FIG. 5 is a phase diagram for carbon dioxide.

Referring now to FIG. 1 and the phase diagram for $CO_2$ shown on FIG. 5, $CO_2$ at 55 atm. and 20° C. is expanded through valve 64a. As a result of the expansion, both the pressure and temperature of the $CO_2$ rapidly drop to approximately 5 atm. and −57° C., at which pressure and temperature $CO_2$ exists as a gas and solid in equilibrium. Therefore, as result of the expansion, the high pressure fluid $CO_2$ changes to an aerosol comprised of $CO_2$ gas and solid particles, or snowflakes, of $CO_2$. The valve 64a may be any of various conventional expansion valves having an aperture through which the fluid expands of approximately 250 μm.

Figure 6:
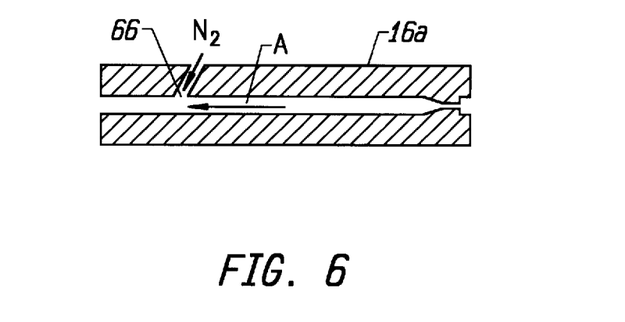
FIG. 6 is a schematic representation of a mixing and acceleration chamber according to the present invention.

The $CO_2$ aerosol exiting valve 64a is applied to a mixing and acceleration chamber 16a wherein the $CO_2$ aerosol is accelerated and mixed with ultra-pure high pressure nitrogen gas. In a preferred embodiment, the mixing and acceleration chamber 16a is formed of stainless steel, engineered plastic, or other similar non-reactive materials, and has a length of approximately 150 mm and a diameter of approximately 12 mm. These dimensions are selected so as to allow the $CO_2$ to accelerate in the direction of arrow A due to expansion of the $CO_2$ gas in preparation for being sprayed out of nozzle 18a. In addition to the expansion and acceleration of the $CO_2$ through the valves 64a, 64b, the $CO_2$ is further accelerated by vaporization and expansion of some of the $CO_2$ particles within the chamber 16a.

Mixing and acceleration chamber 16a further includes a nitrogen mixing station at 66 where ultra-pure high pressure ionized nitrogen is injected into the $CO_2$ aerosol. The injected $N_2$ gas breaks up the $CO_2$ snowflakes into fine particles of approximately 50μm to 1000μm, and optimally about 250μm. Small particles of this size are effective in dislodging small particulates from the pod surfaces to be cleaned. Moreover, the ionization of the nitrogen neutralizes any static electrical charge that may have accumulated in the $CO_2$ aerosol. Finally, the nitrogen gas serves to further accelerate the aerosol spray such that the $CO_2/N_2$ aerosol spray leaves the mixing and acceleration chamber 16a at speeds of between 30 m/s to 60 m/s and optimally about 50 m/s. As described above, the nitrogen gas performs three functions upon the $CO_2$ aerosol: breaking down the $CO_2$ snowflakes, neutralizing static electrical charges, and accelerating the aerosol. It is understood that these three functions may be performed in separate or combined steps, as for example by injecting a fluid into the $CO_2$ aerosol at three separate mixing stations.

A feature of the mixing and acceleration chamber 16a is that it allows static and/or dynamic control over the process parameters of the aerosol spray. In a preferred embodiment of the invention, the chamber 16a accomplishes this two ways: first by changing the length and/or diameter of the chamber 16a, and second by changing the injection rate of $N_2$ gas injected into the chamber 16a.

The chamber 16a may be provided with telescopic sections 70, 72 which allow the length of the chamber 16a to be shortened or lengthened. A sensor system such as for example an optical system including a photodiode and an LED (not shown) may be provided to determine the speed of a $CO_2$ particle within the chamber 16a, average particle size within the chamber 16a and/or the ratio of $CO_2$ particles to $CO_2$ gas. The output from the optical sensor may be fed to the CPU 22, which may then send a responsive signal to mechanical actuators affixed to the chamber 16a to shorten or lengthen the chamber as desired. Changing the length of the chamber 16a allows the acceleration of the $CO_2$ mixture, the size of the $CO_2$ particles, and/or the ratio of $CO_2$ particles to $CO_2$ gas to be controllably altered. It is understood that the chamber 16a may be comprised of more than two telescopic section 70 and 72, and that various other conventional sensors may be provided within mixing and acceleration chamber 16a for indicating the various process parameters such as exit velocity and the size and degree of particle formation within the aerosol. Moreover, as would be appreciated by those skilled in the art, the diameter of the chamber 16a may additionally or alternatively be altered to dynamically control process parameters.

Additionally, the size of the $CO_2$ particles and/or the exit velocity of the aerosol may be controlled by changing the injection flow rate of the nitrogen gas at nitrogen mixing station 66. Feedback from sensors (not shown) provided at the exit of the chamber 16a may be fed to the CPU 22, which may thereupon increase or decrease the flow rate of nitrogen into the chamber 16a as desired.

In a preferred embodiment, the $CO_2/N_2$ aerosol cleaning mixture may be formed remotely from the cleaning chamber and thereafter transferred to the cleaning chamber via hoses 28a, 28b. This offers the advantage that the bulky equipment necessary to handle the high pressure fluids from which the aerosol is formed may be located remotely from the cleaning chamber 12. In one embodiment, the snow generation subsystem 14, including the $CO_2$ reservoir 62, valves 64a, 64b and the chambers 16a, 16b may be located within a separate enclosure 68 (FIGS. 2A and 2B) underneath the cleaning chamber 12. It is further contemplated that the snow generation subsystem may be distally located from the cleaning chamber 12, such that the aerosol is formed in an apparatus completely independent from the cleaning chamber, and subsequently transported to the apparatus via hoses 28a, 28b.

After the fully formed $CO_2/N_2$ aerosol exits mixing and acceleration chamber 16a, the aerosol is carried via tube 28a to the nozzle 18a, whereupon it is sprayed onto the surfaces of the pod 30 to be cleaned. In a preferred embodiment, the aerosol spray leaves the nozzle 18a with a velocity of approximately 50 meters per second, and at a flow rate of approximately 0.5 cubic meters per minute. The small $CO_2$ particles within aerosol strike the particulate contaminants adhered to the surfaces of the pod with a high kinetic energy, which energy is transferred to the contaminants upon contact. The energy imparted to the particulates is generally sufficient to overcome the adhesion forces of the particulates to the pod surfaces, even for small particulates having high adhesion forces. The ionized nitrogen within the aerosol spray is also significant in aiding removal of the particulates by neutralizing static electrical charges on the pod surfaces to thereby decrease the surface adhesion of the particulates to the pod surfaces and each other. An aerosol according to the present invention has been shown to remove particulates of approximately 0.5 μm with a 90% efficiency (where efficiency is defined as the difference between the initial concentration of particulates of a particular size and the concentration of such particulates after cleaning, divided by the initial concentration of such particulates). The cleaning system is able to remove larger particulates with near 100% efficiency.

A further advantage of using the $CO_2/N_2$ aerosol according to the present invention is that, at the ambient pressure within the cleaning chamber, after injection of the aerosol spray onto the surfaces to be cleaned, the solid $CO_2$ particles flash directly to a gas phase. The gas may then be purged from the chamber via circulation subsystem 20 as described above. In this manner, no liquids are used within the cleaning chamber 12, and no separate drying step is necessary. Moreover, the use of a dry aerosol spray, together with the movement of nozzle head 26, allows each of the surfaces within pod 30 to be cleaned without disassembly of the pod beyond separation of the pod cover 31 from pod door 33. As such, no reassembly of pod 30 is necessary after the cleaning process, which reassembly generates contaminants in conventional systems. Moreover, cleaning of the pod 30 without disassembly reduces the overall cleaning time as compared to a system requiring pod disassembly. This feature, together with the omission of a separate drying step allows a pod 30 to be cleaned start to finish in approximately five minutes.

The $CO_2/N_2$ spray tends to cool the surfaces it contacts. Therefore, in order to minimize condensation of moisture and organic contaminants on the surfaces being cleaned, the cleaning chamber 12 includes at least one cold surface acting as a condensation target. The presence of the condensation target as well as the heating of the pods' interior surfaces minimizes condensation of moisture and organic contaminants on the pod interior. The condensation target is kept cold with respect to the interior surfaces of the pod and the circulating fluid within the pod by diverting a small fraction of the cold aerosol spray generated as described above to the targets. The targets are preferably located within the spray assembly and may be the enclosure of the spray assembly itself. The target preferably includes a heating element so that the target may be cleaned at the end of each cleaning cycle, after the pod has been closed, by heating the target and evaporating away the condensed contaminants.

After the cleaning process is completed, a second nitrogen purge is performed as described above to flush out any airborne particulates and aerosol spray remaining within the chamber 12. The nozzle head 26 is returned by the CPU 22 to its retracted position and the pod door 33 is raised by the elevator 38 and once again secured to the pod cover 31 to seal the pod 30 against the external environment. Pod 30 may immediately thereafter be transferred from the cleaning apparatus 10 and loaded with semiconductor wafers.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A method of forming a cleaning mixture for removing particulates of approximately 0.5 microns or larger from surfaces of a pod used for storage and transport of semiconductor wafers, comprising the steps of:
   (a) expanding fluid carbon dioxide ($CO_2$) to form an aerosol comprising gaseous $CO_2$ and particles of $CO_2$;
   (b) accelerating the aerosol formed in said step (a) to a predetermined velocity by the addition of an ionized gas into said aerosol;
   (c) decreasing the size of the particles of $CO_2$ in the aerosol formed in said step (a) by the addition of said ionized gas into said aerosol; and
   (d) neutralizing static electrical charges in the aerosol formed in said step (a) by the addition of said ionized as into said aerosol.

2. A method of forming a cleaning mixture as recited in claim 1, wherein step (c) comprises breaking said $CO_2$ particles to particles approximately 100 microns to 500 microns in size.

3. A method of forming a cleaning mixture for removing submicron or larger particulates from surfaces of a pod used for storage and transport of semiconductor wafers, comprising the steps of:
   (a) expanding fluid carbon dioxide ($CO_2$) to form an aerosol comprising gaseous $CO_2$ and particles of $CO_2$; and
   (b) adding a gas into said aerosol for accelerating the aerosol formed in step (a), decreasing the size of the particles of $CO_2$ formed in step (a), and neutralizing static electrical charges in the aerosol formed in said step (a).

4. A method of forming a cleaning mixture as recited in claim 3, wherein said step (b) comprises adding a nitrogen gas into the aerosol formed in said step (a).

5. A method of cleaning a pod used in the storage and transport of semiconductor wafers, comprising the steps of:
   (a) locating the pod adjacent a cleaning chamber;
   (b) opening the pod to expose surfaces of the pod to be cleaned to the cleaning chamber;
   (c) conditioning surfaces of the pod for cleaning by the steps of:
      (1) injecting an ionized fluid into the pod and chamber for neutralizing static electrical charges on the surfaces of the pod and chamber, and for purging the pod and chamber of airborne contaminants, and
      (2) heating the surfaces of the pod to evaporate moisture and contaminants;
   (d) forming a cleaning mixture by the steps of:
      (1) expanding fluid carbon dioxide ($CO_2$) to form an aerosol comprising gaseous $CO_2$ and particles of $CO_2$, and
      (2) adding a gas into said aerosol for accelerating the mixture formed in step (d)(1), decreasing the size of the particles of $CO_2$ formed in step (d)(1), and neutralizing static electrical charges in the mixture formed in said step (d)(1); and
   (e) spraying the cleaning mixture formed in step (d) on the surfaces of the pod to clean the pod.

6. A method of cleaning a pod used in the storage and transport of semiconductor wafers as recited in claim 5, said step (c)(1) comprising adding nitrogen gas.

7. A method of cleaning a pod used in the storage and transport of semiconductor wafers as recited in claim 5, said step (d)(2) comprising adding nitrogen gas.

8. A method of cleaning a pod used in the storage and transport of semiconductor wafers as recited in claim 5, further comprising performing said step (d) remotely from said cleaning chamber.

9. A method of cleaning a pod used in the storage and transport of semiconductor wafers, comprising the steps of:
   (a) locating the pod adjacent a cleaning chamber;

(b) opening the pod to expose surfaces of the pod to be cleaned to the cleaning chamber;

(c) forming an aerosol cleaning mixture;

(d) adding a gas into said aerosol cleaning mixture for accelerating said aerosol cleaning mixture formed in step (c), decreasing the size of particles contained in said aerosol cleaning mixture, and neutralizing static electrical charges in said aerosol cleaning mixture; and (e) spraying said aerosol cleaning mixture formed in step (c) on the surfaces of the pod to clean the pod.

10. A method of cleaning a pod used in the storage and transport of semiconductor wafers as recited in claim 9, further comprising a step of conditioning surfaces of the pod by injecting an ionized fluid into the pod and chamber for neutralizing static electrical charges on the surfaces of the pod and chambers and for purging the pod and chamber of airborne contaminants.

11. A method of cleaning a pod used in the storage and transport of semiconductor wafers as recited in claim 10, wherein said step of conditioning surfaces of the pod comprises the step of beating the surfaces of the pod to evaporate moisture and contaminants.

12. A method of forming a cleaning mixture for removing submicron or larger particulates from surfaces of a pod used for storage and transport of semiconductor wafers, comprising the steps of:

(a) expanding fluid carbon dioxide ($CO_2$) to form an aerosol comprising gaseous $CO_2$ and particles of $CO_2$; and (b) adding a gas into said aerosol for accelerating the aerosol formed in step (a), decreasing the size of the particles of $CO_2$ formed in step (a) to particles approximately 100 microns to 500 microns in size, and neutralizing static electrical charges in the aerosol formed in said step (a).

* * * * *